Sept. 10, 1957

P. B. HOYE 2,806,097

HIGH VOLTAGE POWER SWITCH

Filed April 20, 1955

5 Sheets-Sheet 1

INVENTOR.
PEDER B. HOYE
BY Kenneth T. Snow
AND Edward L. Benno
ATT'YS.

Sept. 10, 1957 P. B. HOYE 2,806,097

HIGH VOLTAGE POWER SWITCH

Filed April 20, 1955 5 Sheets-Sheet 2

INVENTOR.
PEDER B. HOYE
BY Kenneth T. Snow
AND Edward L. Benno
ATT'YS.

Sept. 10, 1957

P. B. HOYE 2,806,097

HIGH VOLTAGE POWER SWITCH

Filed April 20, 1955

5 Sheets-Sheet 3

INVENTOR.
PEDER B. HOYE
BY Kenneth T. Snow
AND Edward L. Benno
ATT'YS.

Sept. 10, 1957 P. B. HOYE 2,806,097

HIGH VOLTAGE POWER SWITCH

Filed April 20, 1955

5 Sheets-Sheet 4

INVENTOR.
PEDER B. HOYE
BY Kenneth T. Snow
AND Edward L. Benno
ATT'YS.

INVENTOR.
PEDER B. HOYE
BY Kenneth T. Snow
AND Edward L. Benno
ATT'YS.

United States Patent Office 2,806,097

Patented Sept. 10, 1957

2,806,097

HIGH VOLTAGE POWER SWITCH

Peder B. Hoye, Maywood, Ill.

Application April 20, 1955, Serial No. 502,609

14 Claims. (Cl. 200—48)

This invention relates to high voltage power switches, and more specifically to a new and improved high voltage power switch of a type known in the art as the rocker type air break switch.

Switches of this type, as is well known in the art, are usually used for sectionalizing high voltage power transmission lines, isolating branch circuits, bypassing circuit breakers and disconnecting transformers and other apparatus. Switches of this type are usually mounted on high voltage power poles or towers. These high voltage poles or towers generally carry power lines suspended therefrom by line suspension insulators, and these switches, which are usually multi-pole switches, are electrically connected in the power lines to provide means operable to make or break the line circuit. Each pole of these switches generally comprises a switch base mounted to the cross arms of the pole or tower, a pair of fixedly mounted upstanding insulators, a rocking insulator mounted between the pair of upstanding insulators, an interphase rocker shaft fastened to the rocking insulator, a rod operably mounted to the rocker shaft and extending to ground level, a pair of links pivotally interconnected at one end of each thereof and pivotally connected at the other ends thereof to the rocking insulator and to one of the upstanding insulators, a contact member on the other upstanding insulator and a braided ribbon conductor including another member of a contact and supported by the pair of links. As the rocking insulator is pivoted to operate the switch to a closed position, the contact member connected to the braided ribbon conductor makes contact with the one contact member mounted on the mentioned other upstanding insulator to complete a high voltage power circuit from one upstanding insulator to the other upstanding insulator.

In an effort to reduce the weight and cost of these switches, the art has produced a switch similar to that described except that the upstanding insulator connected to one end of one of the links is removed and that end of the link is pivotally mounted to the line suspension insulator adjacent thereto.

The principal difficulty that has been encountered in the use of all rocker type switches has been that the braided ribbon conductors are inherently weak, and are very susceptible to corrosion and deterioration. Therefore, the life of these braided ribbon conductors are short with the result that breakdowns are common and the maintenance cost of these switches is high.

Therefore, it is a principal object of this invention to provide switches of the above mentioned type which eliminate the necessity of the braided ribbon conductors and which will simply and efficiently operate to carry the full current of the associated power line under all necessary conditions of operation.

It is another important object of this invention to provide a high voltage power switch of the rocker type in which the full line current is carried by rigid, non-yielding conductors through a minimum of electrical contacts.

It is another important object of the present invention to provide a switch of the rocker type in which the full line current is carried by rigid, non-yielding conductors through a minimum of electrical contacts wherein the switch will accommodate power lines approaching the switch at any angular disposition without impairing the operation of the switch.

Another object of the present invention is to provide a rocker type switch carrying current through rigid, non-yielding conductors through a minimum of electrical contacts wherein the rigid conductors may be moved and rotated relative to their longitudinal axes while maintaining sufficient electrical contact therebetween to carry the full line current.

Another object of the present invention is to provide a pair of switch contacts in a rocker type air break switch wherein an increased moment is provided for breaking any ice which may form about the switch contacts.

A further object of the present invention is to provide a combined electrical and mechanical connective means between the conductive members of a switch in a manner to provide free movement of the conductors in planes at various angles with respect to each other.

A further object of the present invention is the provision of a sliding electrical joint between the ends of two elongated conductors arranged to permit unlimited angular rotation of one conductor about its longitudinal axis and to permit a great amount of pivotal movement of the same conductor relative to the other conductor about an axis substantially perpendicular to the longitudinal axis thereof, but to prevent any other movement of the conductors relative to each other.

A further object of the present invention is to provide a novel two-directional movement of the conductive links of a high voltage power switch without effecting the current capacity between the conductive links.

A further object of the present invention is to provide an electrical and mechanical joint for electrical switches in which there is provided a socket for an electrical conductor and contact therein on the outer circumference of the socket and arranged to permit rotational movement of the conductor therein and to further permit pivotal movement between the conductors without impairing the electrical or mechanical characteristics of the joint.

Other objects and the features of the present invention will become apparent upon a perusal of the following specification and drawings, of which:

Figures 1, 22:
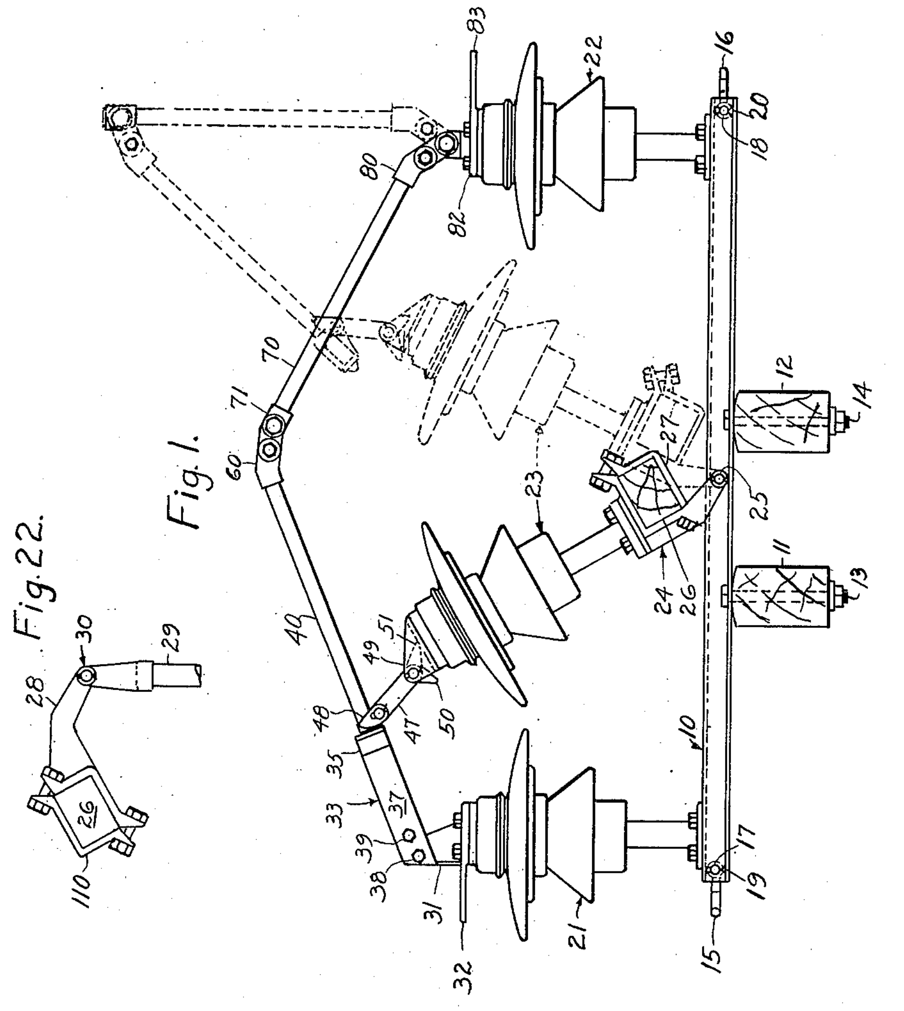
Figure 1 is a side elevational view of a single pole high voltage rocker type switch arranged for multi-pole remote control ganged operation.
Figure 2:
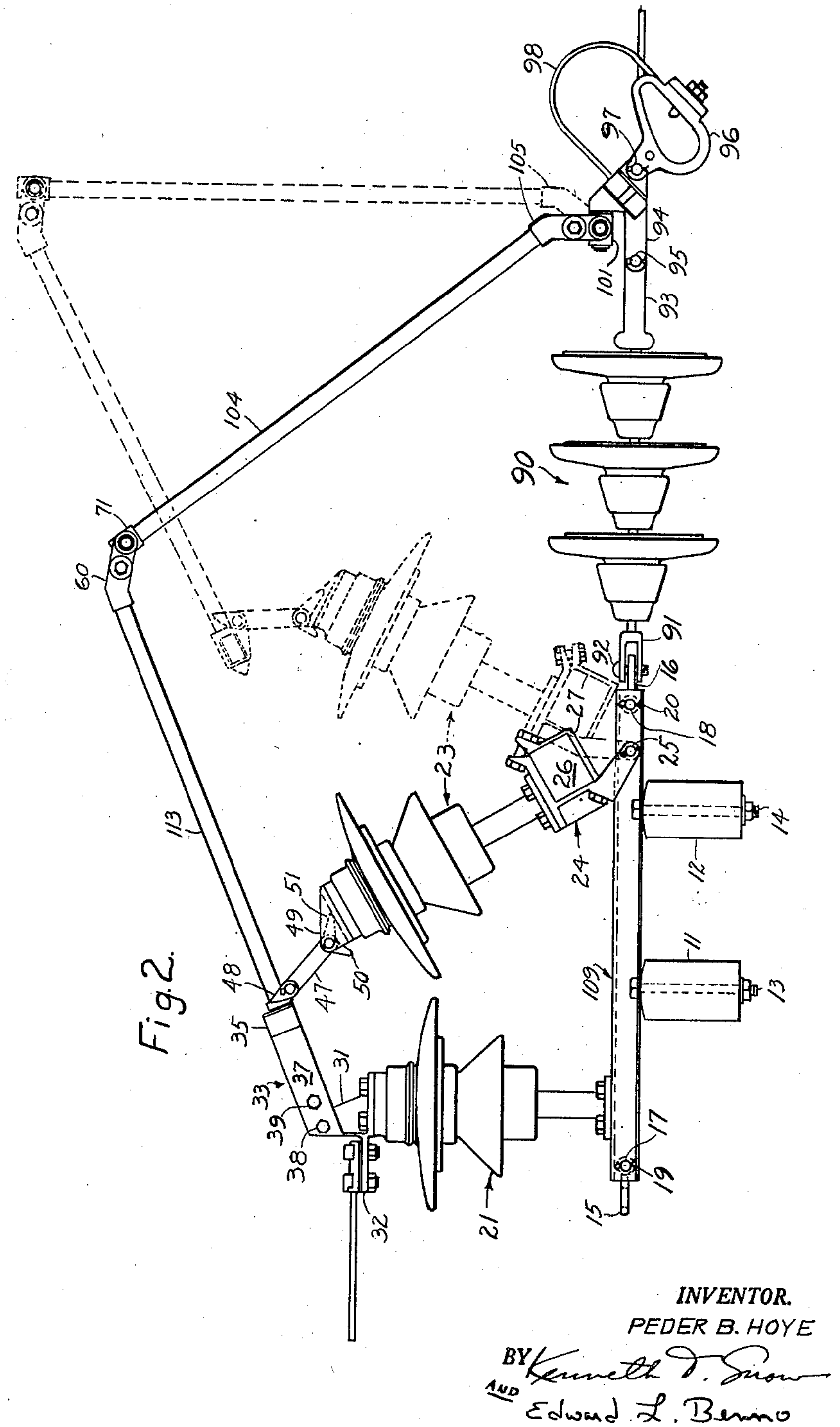
Figure 2 is a side elevational view of another embodiment of a single pole high voltage rocker type switch.
Figures 18, 20:
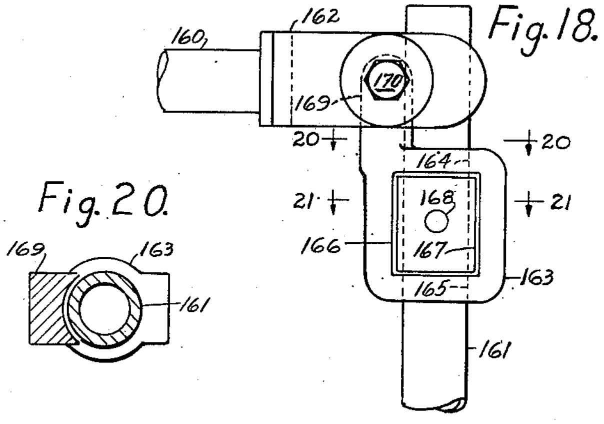
Figure 18 is a side elevational view of another embodiment of a joint such as shown in Figures 14 through 17.
Figure 20 is a cross sectional view of the structure shown in Figure 18 and taken along the line 20—20.
Figure 21:
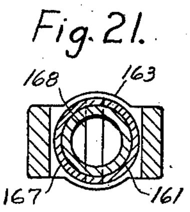

Figure 21 is a cross sectional view of the structure shown in Figure 18 and taken along the line 21—21; and Figure 22 is a cross sectional view of the interphase shaft 26 of Figures 1 and 2 taken in a plane parallel to the planes of Figures 1 and 2 and showing the operating means for ganged operation of multi-pole switches.

For a detailed description of the various embodiments of the present invention reference is first made to Figure 1. A switch base 10 is provided and is fixedly mounted on and fastened to a pair of spaced apart cross arms 11 and 12 by means of bolts 13 and 14. The switch base 10 is provided with a pair of pull rings 15 and 16 pivotally mounted at each end thereof by means of pins 17 and 18. The pins 17 and 18 are locked therein by means of cotter pins 19 and 20.

A switch insulator 21 of the cap and pin type is fixedly mounted to upstand from the base 10. A second switch insulator 22 of the cap and pin type is fixedly mounted and upstanding from the base 10 and in a spaced apart relationship to the insulator 21.

A third insulator 23 of the cap and pin type is rockingly mounted between insulators 21 and 22 to generally pivot in a plane through the longitudinal axes of insulators 21 and 22. The lower end of the insulator 23 is secured to a bracket 24, and the bracket 24 is pivotally mounted to the base 10 by means of a pin 25. A wooden interphase shaft 26 is clamped between the bracket 24 and a bracket 27 by any well known means.

As can be seen in Figure 22, an arm 28 is mounted to the interphase shaft 26 by a bracket 110 to extend therefrom and is positioned in a plane other than the general plane of the switch. A vertically reciprocating rod 29 is pivotally mounted to the end of the arm 28 by means of pivotal mounting means 30. The rod 29 depends downwardly to a position adjacent ground level and is operable thereat to reciprocate the rod 29 upwardly and downwardly. The arm 28 is further so positioned on interphase shaft 26 that as the rod 29 is reciprocated vertically upwardly and downwardly by an operator on the ground, the interphase shaft 26 is moved in an arc and the rocking insulator 23 is caused to pivot about pin 25 in a plane through the longitudinal axes of the three insulators 21, 22 and 23 and in counterclockwise and clockwise directions respectively as viewed in Figure 1. The rocking insulators of any other switches mounted on interphase shaft 26 would also be pivoted simultaneously in the rocking insulator 23.

Figures 3, 4:
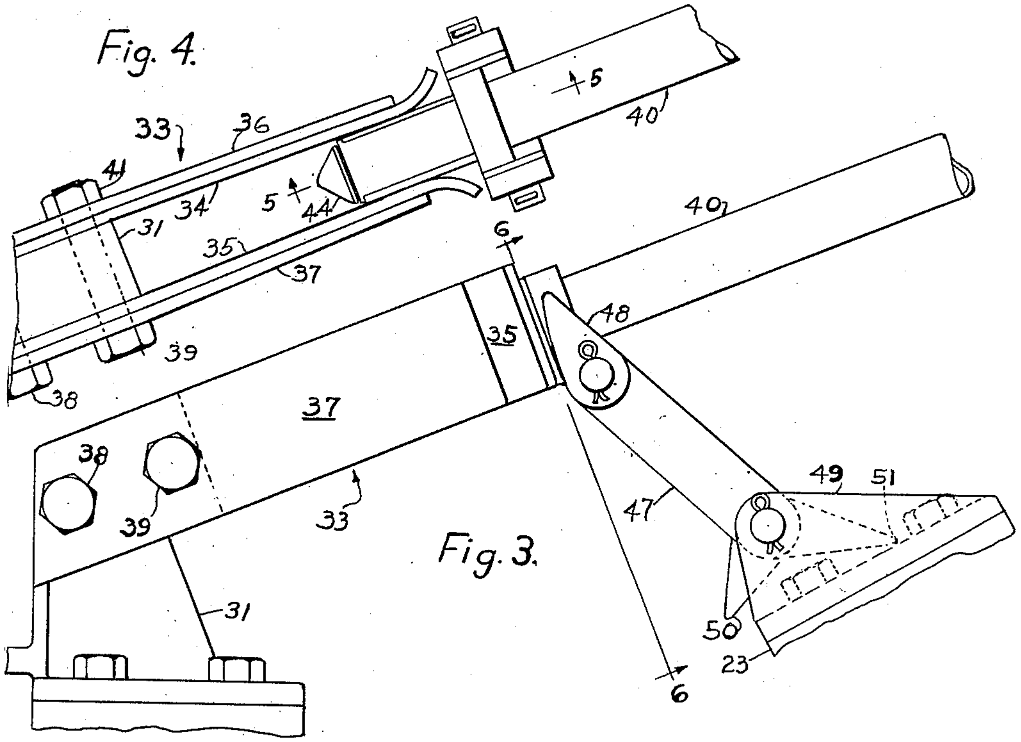
Figure 3 is an enlarged fragmentary view in side elevation of the separable contacts employed in the switches of Figures 1 and 2.
Figure 4 is a top plan view of a portion of the structure shown in Figure 3.

To the top of the insulator 21, a bracket 31 is fixedly mounted by any means well known in the art. The bracket 31 which is formed of a very efficient current carrying material is provided with an extending terminal 32. The power line (not shown) is electrically connected to the extending terminal 32 by any means well known in the art. A snubbed power line (not shown) may be supported by a line suspension insulator (not shown) which is in turn supported by the pull ring 15 and the power line may be extended therefrom to the extending terminal 32. Further, in a sub-station application the line suspension insulator may be omitted and a current carrying strap may be directly connected to the extending terminal 32. The female portion 33 of a contact switch is fixedly secured to the top of the bracket 31 and positioned to extend in an upwardly inclined direction toward the remainder of the switch structure. The female portion 33 comprises a pair of parallelly spaced apart bar contacts 34 and 35 and a pair of bar-shaped contact springs 36 and 37. Bar spring 36 is disposed adjacent bar contact 34, and bar spring 37 is disposed adjacent bar contact 35, and these elements are fixedly mounted to the bracket 31 by means of bolts 38 and 39 and nuts 41, as can easily be seen in Figures 3 and 4. The free ends of the bar contacts 34 and 35 are flared outwardly to permit the easy entrance of the male portion of the switch contacts therebetween. The bar springs 36 and 37 are biased toward each other to exert a closing pressure between the bar contacts 34 and 35 and the male portion of the switch contacts.

Figure 6:
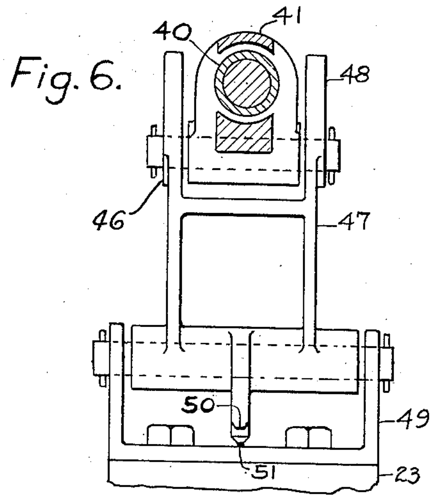
Figure 6 is a cross sectional view of the structure shown in Figure 3 and taken along the line 6—6.
Figure 5:
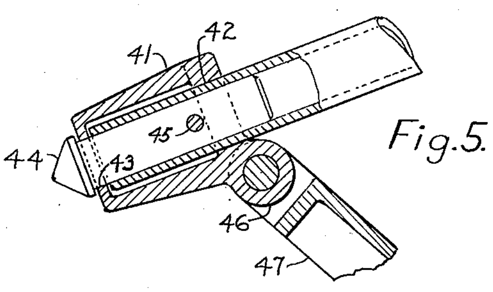
Figure 5 is a cross sectional view of the structure shown in Figure 4 and taken along the line 5—5.

The male portion of the switch contacts which is provided for cooperation with the female portion 33 of the contact switch, comprises the outer surface of the tubular blade member or conductive link 40 and the structure mounted at one end thereof. The tubular blade member 40 is formed of a rigid material having a high electrical conductivity. The lower end of the tubular blade member 40 is provided with a carrier member 41 which is formed to have an opening 42 at one end thereof which is substantially equal to the outside diameter of the tubular blade member 40. Axially in alignment with the opening 42, the carrier member 41 is provided with an opening 43 of which the diameter thereof is substantially equal to the inner diameter of the tubular blade member 40, as can easily be seen in Figure 5. A pin 44 having a domed head and an annular flange formed adjacent the domed head is also provided. The shank of the pin 44 is substantially equal to the inner diameter of the tubular blade member 40. The annular flange on the pin 44 has an outside diameter substantially equal to the outside diameter of the tubular blade member 40. The pin 44 is mounted with the shank thereof within the lower end of the tubular blade member 40, and is secured therein by a pin 45 projecting through the pin 44 and the walls of the tubular blade member 40. The carrier 41 is further formed to expose opposite sides of the lower end of the tubular blade member 40 between the bar contacts 34 and 35, so that the bar contacts 34 and 35 make direct electrical contact with the sides of the tubular blade member 40, as can easily be seen in Figure 4. Thus, it may easily be seen that the tubular blade member 40 is mounted within the carrier member 41 for rotational movement about the longitudinal axis of the blade member 40, while movement in either direction along the longitudinal axis of the blade member 40 relative to the carrier 41 is prevented. The pin 44 further serves to support the walls of the lower end of the tubular blade member 40 so that the sides of the tubular blade member 40 which make contact with the bar contacts 34 and 35 will not be deformed by the bar contacts 34 and 35 through the noted closing pressure. The carrier member 41 is further provided with one portion 46 of a hinge connection, wherein the pivotal axis thereof is disposed rearwardly of and downwardly from the mating contact surfaces of the bar contacts 34 and 35 and the lower end of the tubular blade member 40, as can easily be seen in Figures 3, 4 and 5. A link 47 is provided, and is pivotally mounted at one end thereof to the hinge portion 46 of the carrier member 41. The link 47 has a cam portion 48 formed thereon to extend upwardly from the end of the link 47. The cam portion 48 is positioned in alignment with the outwardly turned free end of the bar contact 35, so that when the link 47 is pivoted in a counterclockwise direction, as viewed in Figures 1 and 3, about the described hinge or pivotal connection, the cam portion 48 will bear against the outwardly turned free end of the bar contact 35 to provide a leverage moment for drawing the lower end of the tubular blade member 40 from engagement between the pair of bar contacts 34 and 35. Although only one cam portion 48 is described, it may easily be seen that another cam portion 48 may be formed on the other side of the link 47, as shown in Figure 6, to cooperate with the outwardly turned free end of the bar contact 34. The lower end of the link 47 is pivotally mounted to a bracket 49 which in turn is secured to the top of the rocking insulator 23 by any means well known in the art.

In order to provide for proper leverage moments in the pivotal movement of the rocking insulator 23 and the link 47, the lower end of the link 47 is formed to have a pair of limit stops 50 and 51. The limit stops 50 and 51 are arranged in the manner of an inverted V, and the limit stops 50 and 51 cooperate with the bracket 49 as the rocking insulator 23 is pivoted about the pin or pivotal mounting means 25. It should be noted that when the rod 29 is moved upwardly to pivot the rocking insulator 23, in a counterclockwise direction as viewed in Figure 1, to move the switch to the closed position, the limit stop 51 cooperates with the bracket 49 so that the pivotal connection between the lower end of the link 47 and the bracket 49 lies slightly clockwise, as viewed in Figure 1, of a plane through the hinge portion 46 and the piovtal mounting means 25. However, if the rod 29 is moved downwardly to pivot the rocking insulator 23 in a clockwise direction as viewed in Figure 1, it can be seen that the limit stop 50 will permit the pivotal axis between the lower end of the link 47 and the bracket 49 to be moved further clockwise, as viewed in Figure 1, of a plane through the hinge portion 46 and the pivotal mounting means 25. This displacement of the pivotal axis between the lower end of the link 47 and the bracket 49 provides a relatively large leverage moment to aid in drawing the lower end of the blade member 40 from the female portion 33. This may be likened to a powerful toggle or pry-out effect, and is useful when the bias exerted by bar springs 36 and 37 is high or when the switch is covered with ice.

Figures 7, 8:
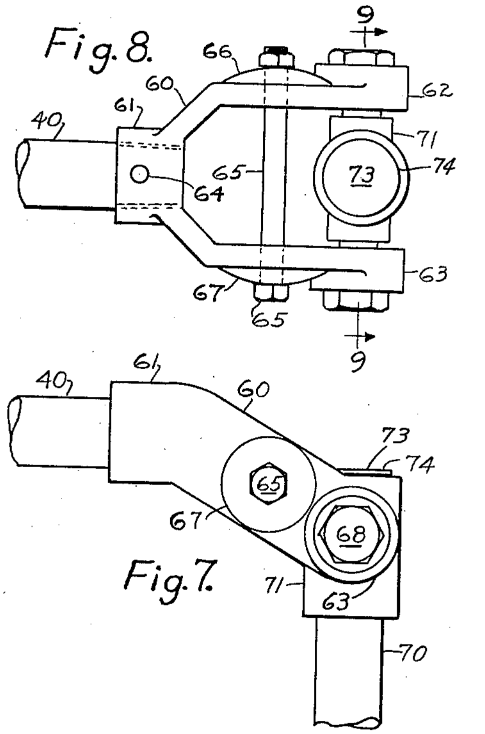
Figure 7 is a fragmentary view in side elevation of the joint connecting the upper ends of the tubular blade members or conductive links of the switches as shown in Figures 1 and 2.
Figure 8 is a top plan view of the joint as shown in Figure 7.

The other end of the tubular blade member 40, which as previously described is a rigid member having a high current-carrying capacity, is fixedly secured in a forked bracket 60 as can be seen in Figure 8. The bracket 60 comprises a shank portion 61 and two angled leg portions 62 and 63. The shank portion 61 is threaded, as is the upper end of the tubular blade member 40, and the shank portion 61 is threaded thereon and secured against removal by a pin 64 which is mounted through the shank portion 61 and the upper end of the tubular blade member 40. The bracket 60 is formed of a material having a high current capacity, and is further provided with a tie bolt 65 which is mounted between the legs 62 and 63. Dish-shaped springs 66 and 67 are mounted between each end of the tie bolt 65, and the legs 62 and 63 respectively, to bias the ends of the legs 62 and 63 toward each other. The ends of the legs 63 and 62 are threaded to respectively receive a pair of contact screws 68 and 69.

Figure 9:
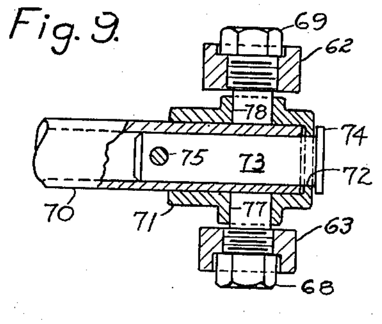
Figure 9 is a cross sectional view of the structure shown in Figures 7 and 8 and taken along the line 9—9 of Figure 8.

A tubular blade member 70 is also provided, and this blade member 70 is similar in construction to tubular blade member 40. Importantly it also is formed of a rigid material having a high electrical conductivity. The upper end of the tubular blade member 70 is provided with a carrier 71. The carrier 71 is provided with a cylindrical opening longitudinally therethrough having a diameter substantially equal to the outer diameter of the tubular blade member 70. One end of the carrier member 71 is provided with an inwardly extending flange portion 72. The flange portion 72 extends inwardly a distance substantially equal to the wall thickness of the tubular blade member 70. A pin 73 having an annular flange 74 at one end thereof is also provided. The shaft of the pin 73 has a diameter substantially equal to the inner diameter of the tubular blade member 70, and the pin 73 is mounted with the shank thereof within the upper end of the tubular blade member 70. A pin 75 is mounted through the tubular blade member 70 and the pin 73 to secure the pin 73 against any axial movement longitudinally of the tubular blade member 70. The flange portion 74 of the pin 73 projects against the end of the carrier member 71 having the inwardly turned flange portion 72 formed thereon, so that the flange portion 74, the pin 73 and the flange 72 of the carrier member 71 prevent any movement of the carrier member 71 along an axis longitudinally of the tubular blade member 70. However, it must be noted that the carrier member 71 may be rotated about the longitudinal axis of the tubular blade member 70. The carrier member 71 is further provided with a pair of openings 77 and 78 therethrough disposed along a common axis which is perpendicular to the longitudinal axis of the tubular blade member 70, as can easily be seen in Figure 9. The openings 77 and 78 are of a diameter substantially equal to the diameter of the contact screws 68 and 69, and the contact screws 68 and 69 are threaded into the ends of the legs 62 and 63 and through the openings 77 and 78 into contact with opposed portions of the upper end of the tubular blade member 70, as can be easily seen in Figure 9. The contact screws 68 and 69 are formed of a material having a high electrical conductivity, and the ends thereof abutting the surface of the tubular blade member 70 may be slightly dome-shaped to provide good electrical contact therebetween should the various parts become slightly misaligned. The shaft of the pin 73 further serves to prevent any deformation of the upper end of the tubular blade member 70 by the contact screws 68 and 69. Thus it can be seen that the tubular blade member 70 may be rotated about its longitudinal axis within the carrier member 71 and may be pivoted about an axis perpendicular to the longitudinal axis of the tubular member 70 while constantly and efficiently maintaining a sliding pressure contact between the ends of the contact screws 68, 69 and the tubular blade member 70 which is capable of conducting a heavy current from tubular blade member 70 to tubular blade member 40 through forked bracket 60.

Figure 13:
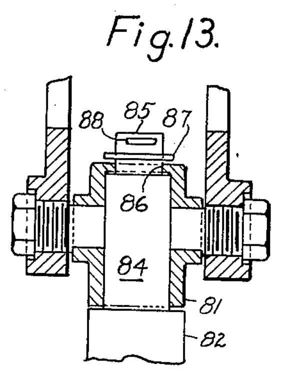
Figure 13 is a cross sectional view of the structure shown in Figure 12 and taken along the line 13—13.

The lower end of the tubular blade member 70 is provided with a forked bracket 80 which is substantially identical in construction to the forked bracket 60 and is mounted to the lower end of the tubular blade member 70 in substantially the same manner that bracket 60 is mounted to the upper end of the tubular blade member 40. The bracket 80 which is shown in enlarged views in Figures 12 and 13 cooperates with a carrier member 81 which is substantially identical to carrier member 71.

A bracket 82 is mounted on top of insulator 22 by any means well known in the art, and includes as an integral part thereof, a terminal 83 extending therefrom. The terminal 83 is substantially identical to terminal 32 of bracket 31 and serves a substantially identical function. The bracket 82 is formed of a material having a high electrical conductivity and is further formed to have a cylindrical portion 84 upstanding therefrom with another cylindrical portion 85 upstanding therefrom. The cylindrical portion 84 has a diameter substantially equal to the inner diameter of carrier member 81. The carrier member 81 is provided with an inwardly projecting flange 86, and the cylindrical portion 85 of the bracket 82 has a diameter substantially equal to the inner diameter of the flange 86. The carrier member 81 is mounted over the cylindrical portions 84 and 85 as can easily be seen in Figure 13. A washer 87 is then mounted over the cylindrical portion 85 and a cotter pin 88 is mounted through the cylindrical portion 85 above the washer 87 to maintain the washer 87 mounted about the cylindrical portion 85. Thus it can easily be seen that the carrier 81 may rotate about the longitudinal axis of the cylindrial portion 84, but is prevented from any movement along the longitudinal axis of the cylindrical portion 84 by the flange 86 and the washer 87. The contact screws mounted through the ends of legs of the forked bracket 80 are substantially identical in construction and operation to contact screws 68 and 69, to thereby maintain a complete electrical circuit of a high current capacity between the cylindrical portion 84 and the legs of the forked bracket 80 as the carrier member 81 is rotated about the longitudinal axis of the cylindrical portion 84 and as the tubular blade member 70 is pivoted about the longitudinal axis of the contact screws.

From the foregoing it can be seen that the switch of the subject invention will carry a heavy current from the terminal 83, through bracket 82, through the pair of contact screws in the end of the legs of the forked bracket 80, through the forked bracket 80, through the tubular blade member 70, through the contact screws 68 and 69, through the forked bracket 60, through the tubular blade member 40, through the bar contacts 34 and 35, and through the bracket 31 to the terminal 32. Although the insulator 22 has been described as positioned within the plane through which the rocking insulator 23 is pivotable, it is apparent that the insulator 22 need not be positioned in that plane, but importantly may be positioned in any plane parallel to that plane.

As previously described, the switch of this invention is operated by the reciprocating movement of the rod 29, and when the rod 29 is reciprocated to the extreme downward position, the rocking insulator 23 and the various members connected thereto and to the insulator 22 will assume a position shown in the dotted lines in Figure 1.

Figure 11:
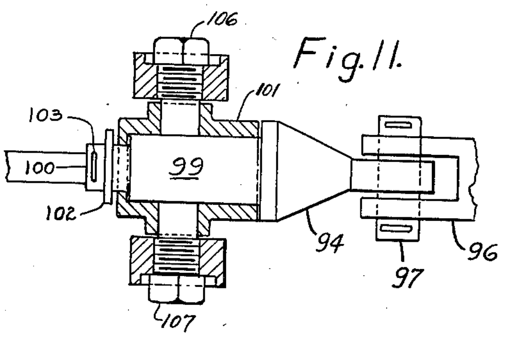
Figure 11 is a cross sectional view of the structure shown in Figure 10 and taken along the line 11—11.
Figures 10, 12:
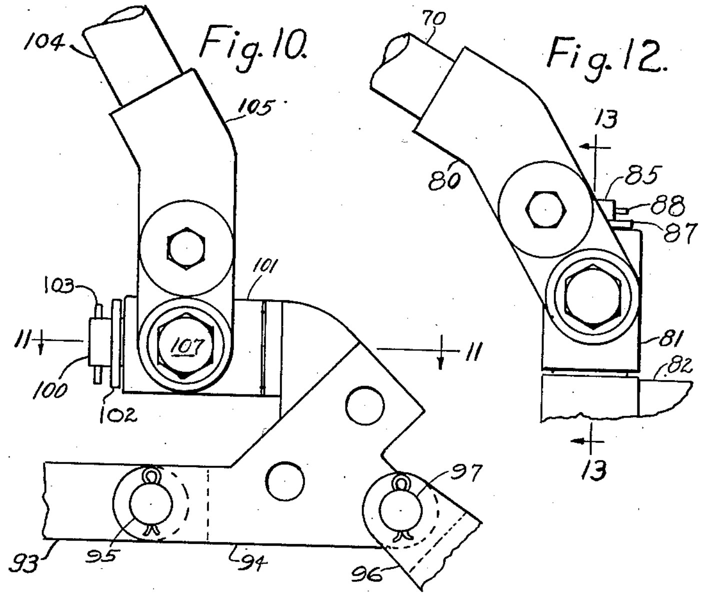
Figure 10 is an enlarged fragmentary view in side elevation of the joint connecting the lower end of the swinging link of Figure 2 to the line terminal structure thereof, as shown in Figure 2.
Figure 12 is an enlarged fragmentary plan view of the joint connecting the lower end of the swinging link of Figure 1 to the line terminal structure thereof, as shown in Figure 1.

For a detailed description of the embodiment of the present invention shown in Figure 2 reference is made thereto. This embodiment is similar in many respects to the embodiments previously described and like parts have been designated with identical numbers. The important difference in this embodiment is the removal of the insulator 22. In this embodiment, the switch of the subject invention is mounted in cooperation with a line suspension insulator 90 of the ball and socket type well known in the art. The line suspension insulator 90 is mounted through a clevis 91 and a pin 92 to the pull ring 16 which is pivotally mounted to a base 106 which is shorter than the base 10. The live side of the line suspension insulator 90 is provided with a link 93 which is in turn connected to a terminal structure 94 by means of any well known connecting means 95. A strain clamp 96 is mounted to the terminal structure 94 by means of any well known connecting means 97. The line 98 is snubbed about the strain clamp 96 and is electrically connected to the terminal structure 94 by any means well known in the art. The terminal structure 94, which is shown in enlarged detail views in Figures 10 and 11, is provided with a cylindrical portion 99 and a cylindrical portion 100 of a smaller diameter extending therefrom with the longitudinal axes thereof positioned paralled to the longitudinal axis of line suspension insulator 90. A carrier member 101 substantially identical to carrier member 81, a washer 102 substantially identical to washer 87, and a cotter pin 103 substantially identical to cotter pin 88 are also provided. The tubular blade member 90 is replaced in this embodiment by a longer tubular blade member 104. A forked bracket 105 is mounted on the lower end of the tubular blade member 104, and the forked bracket 105 is substantially identical to forked brackets 60 and 80. Contact screws 106 and 107, substantially identical to contact screws 68 and 69, are also provided. Thus, it can easily be seen that the carrier member 101 is rotatable about the longitudinal axis of the cylindrical portion 99 while the carrier member 101 is prevented from any movement along the longitudinal axis of the cylindrical portion 99. Further, the tubular blade member 104 and the forked bracket 105 are pivotable about the axis through contact screws 106 and 107. The remaining differences of this embodiment over the previously described embodiment are slight differences in structures having the same functions. The tubular blade member 113 is slightly longer than tubular blade member 40. The arm 28 would be positioned oppositely from that described in regard to Figure 1 so that the reciprocating movement of rod 29 is reversed relative to the opening and closing of the switch. When the rod 29 is moved upwardly the switch is moved to the open position and when the rod 29 is moved downwardly the switch is moved to the closed position.

The switch of the present embodiment is particularly well suited to efficient operation thereof when the line suspension insulator 90 is disposed at an infinite number of positions. For example, should the power line 98 be swung in a horizontal plane, the line suspension insulator 90 will follow the power line 98 by a rotation about pivotal mounting means 92. It can further be seen that the carrier member 101 will be rotated about the cylindrical portion 99 and the forked member 105 will be rotated about an axis through the contact screws 106 and 107. Further, the tubular blade member 104 will be rotated about its longitudinal axis within the carrier member 71, and the tubular blade member 113 will be rotated relative to the tubular blade member 104 about an axis through the contact screws 68 and 69. It thus can be seen that the various elements of the present embodiment are swingable relative to each other without impairing the conduction of the line current through the switch. Further, the switch may be operated to the open position from any of these described positions.

Figures 14, 15:
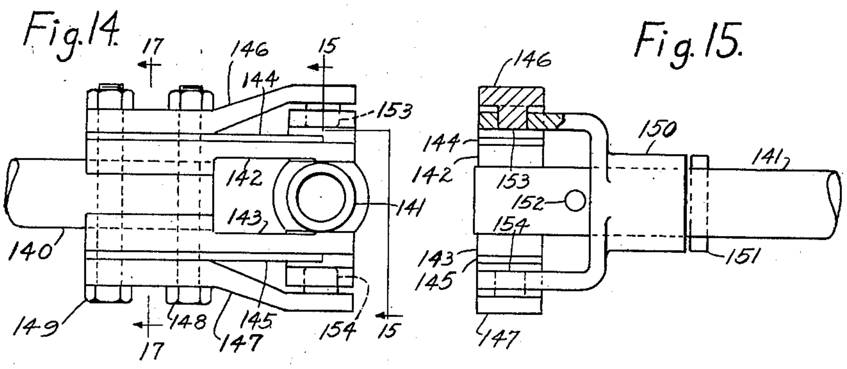
Figure 14 is a view in elevation of a portion of another embodiment of a joint between two of the tubular blade members of switches such as those shown in Figures 1 and 2.
Figure 15 is a view partially in section of the structure shown in Figure 14 and taken along the line 15—15.
Figure 16:
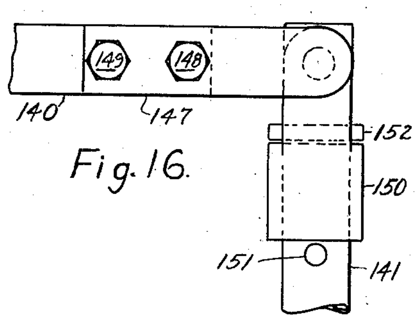
Figure 16 is a side elevational view of the structure shown in Figure 14.
Figure 19:
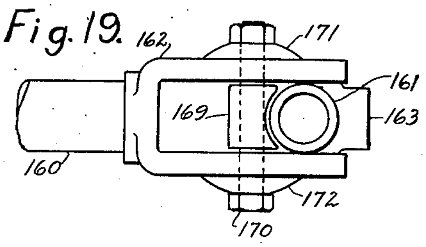
Figure 19 is a top elevational view of the structure shown in Figure 18.
Figure 17:
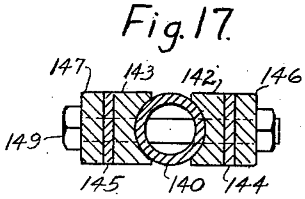
Figure 17 is a cross sectional view of the structure shown in Figure 14 and taken along the line 17—17.

Turning next to a detailed description of the embodiment of the present invention shown in Figures 14 through 17, reference is made thereto. In this embodiment the current carrying means between the two rigid tubular blade members 140 and 141 is separated from the pivoting means between these tubular blade members. Firstly, a pair of bar contacts 142 and 143 are provided. A portion of one side of each of the bar contacts 142 and 143 is formed as a cylindrical surface as can easily be seen in Figure 17. A pair of leaf springs 144 and 145 are also provided, as are a pair of pivoting members 146 and 147. The bar contacts 142 and 143 are mounted on opposite sides of and encircle the tubular blade member 140. The leaf springs 144 and 145 are then positioned against the outer surfaces of the bar contacts 142 and 143, respectively, and the pivoting members 146 and 147 are positioned against, and extend longitudinally in the same direction, to the leaf springs 144 and 145, respectively, as can be seen in Figures 14 and 17. A pair of fasteners 148 and 149 are then mounted through the pivoting members 146 and 147, the leaf springs 144 and 145, the bar contacts 142 and 143, and the tubular blade member 140 to secure these described members onto one end of the tubular blade member 140. The tubular blade member 141 is provided with a carrier member 150. The carrier member 150 comprises a cylindrical portion integrally formed with a U-shaped portion. The cylindrical portion of the carrier member 150 has an inner diameter substantially equal to the outer diameter of the tubular blade member 141, and the U-shaped portion of the carrier member 150 comprises two legs which are spaced apart a distance slightly less than the distance between the outer ends of the pivoting members 146 and 147. The cylindrical portion of the carrier member 150 is positioned about the tubular blade member 141 substantially at one end thereof, as seen in Figure 15. The tubular member 141 is free to rotate about its longitudinal axis within the carrier member 150, and the tubular blade member 141 is prevented from any movement along its longitudinal axis by a pair of pins 151 and 152 which are secured through the tubular blade member 141 at each end of the cylindrical portion of the carrier member 150. To pivotally interconnect the above described elements, the pivoting members 146 and 147 are provided with inwardly projecting pin portions 153 and 154. The pin portions 153 and 154 may be integrally formed as part of the pivoting members 146 and 147, or they may be secured to the outer ends of the pivoting members 146 and 147. The pin portions 153 and 154 are each positioned within an opening through one of the legs of the U-shaped portion of the carrier member, as seen in Figure 15. This interconnection of the pivoting members 146 and 147 and the carrier member 150 causes the bar contacts 142 and 143 to engage the outer curved surface of the tubular blade member 141 as can easily be seen in Figures 14 and 15. The bar contacts 142 and 143 make good electrical contact with the tubular blade member 141 and are urged in continuing pressure contact therewith by leaf springs 144 and 145. Thus it may be seen that the tubular blade member 141 is pivotally mounted relative to the tubular member 140, and that this pivoting is directed about an axis through the pin portions 153 and 154, and through the points of electrical contact of the bar contacts 142 and 143 with the outer surface of the tubular blade member 141. It can also be seen that the tubular blade member 141 is rotatable about its longitudinal axis while maintaining good electrical contact with the bar contacts 142 and 143. It is further evident that while the tubular blade members 141 and 140 are pivoted relative to each other, and while the tubular blade member 141 is rotated about its longitudinal axis, a full electrical current will be carried between the tubular blade member 141, bar contacts 142 and 143, and tubular blade member 140.

Turning next to the embodiment of the present invention shown in Figures 18 through 21, reference is made thereto for a detailed description thereof. Importantly in this embodiment of the invention, the axis about which the tubular blade members are pivoted relatively is offset from the axis through the areas of sliding electrical contact between the tubular blade members. In this embodiment rigid tubular blade members 160 and 161 are provided. To one end of the tubular blade member 160 a forked bracket 162 is secured. To the tubular blade member 161 a carrier member 163 is mounted. The carrier member 163 is provided with a pair of axially aligned openings 164 and 165 and an opening 166 through the center thereof. The axially aligned openings 164 and 165, as shown in Fig. 18, have a diameter substantially equal to the outer diameter of the tubular blade member 161, and the tubular blade member 161 is mounted through these openings 164 and 165. An annular member 167 having an inner diameter substantially equal to the outer diameter of the tubular blade member 161 and having an outer diameter some amount less than the width of the opening 166 is mounted about the tubular blade member 161 within the opening 166 of the carrier member 163 as seen in Figure 18. A pin 168 secured to and through the annular member 167 and the tubular blade member 161 maintains the annular member 167 secured to the tubular blade member 161. It can thus be seen that the tubular blade member 161 is rotatable about its longitudinal axis within the carrier member 163, and is prevented from any movement along its longitudinal axis relative to the carrier member 163 by the annular member 167. The carrier member 163 is further formed with an extending flange portion 169 on one side thereof, as will be seen in Figure 18. The extending flange portion 169 is provided with an opening therethrough and is positioned between the legs of the forked bracket 162. The legs of the forked bracket 162 are provided with a pair of axially aligned openings therethrough which are also axially aligned with the opening through the extending flange portion 169. A fastener 170 and a pair of dish-shaped springs 171 and 172 are also provided. The dish-shaped springs 171 and 172 are positioned on the outer surfaces of the legs of the forked bracket 162 in alignment with the openings therethrough and the fastener 170 is mounted through the dish-shaped springs 172, the openings through the legs of the forked bracket 162 and the opening through the extending flange portion 169 of the carrier member 163, as evident from Figures 18 and 19. The fastener 170 and the dish-shaped springs 171 and 172 cooperate to bias the legs of the forked bracket 162 toward each other, and the outer ends of the legs of the forked bracket 162 are positioned to make contact with opposing areas of the outer surface of the tubular blade member 161, as can easily be seen in Figure 19. Thus good electrical contact is maintained between the tubular blade member 161 and the tubular blade member 160 through the legs of the forked bracket 162. This good electrical contact is maintained in all positions of relative pivoting between the tubular blade members 160 and 161 about the longitudinal axis through the fastener 170 and in all positions of rotation of the tubular blade member 161 about its longitudinal axis.

It should be noted from the foregoing description of Figures 14 through 21, that the embodiment shown therein and described herein may easily be substituted for one or more of the connecting means at the ends of the tubular blade members shown in Figures 1 and 2.

Having described the invention, what is considered new and desired to be protected by Letters Patent is:

1. In an electric switch of the rocker type, two elongated rigid conductors, one of said conductors formed substantially at one end thereof as a curvilinear surface, means for connecting said one of said conductors to the other of said conductors for relative pivotal movement therebetween and for rotative movement about the longitudinal axes of said conductors, said means comprising a carrier member mounted about said one end of said one of said conductors for rotative movement about the longitudinal axis of said one of said conductors while prevented from any movement along the longitudinal axis of said one of said conductors, a forked bracket secured to the end of said other of said conductors, the ends of the legs of said forked bracket carrying opposing contact surfaces, said opposing contact surfaces of the legs of said forked bracket positioned to engage said curvilinear surface of said one of said conductors and formed to cooperate with said carrier member in a pivotal relationship to maintain a full current path between said conductors through all movements of said conductors.

2. In an electric switch of the rocket type, two elongated rigid conductors, one of said conductors formed substantially at one end thereof as a curvilinear surface, means for connecting said one of said conductors to the other of said conductors for relative pivotal movement therebetween and for rotative movement about the longitudinal axes of said conductors, said means comprising a carrier member mounted about said one end of said one of said conductors for permitting rotative movement of said one of said conductors about its longitudinal axis while preventing any movement of said one of said conductors along its longitudinal axis, a forked bracket secured to one end of the other of said conductors, a pair of contact screws threaded through the ends of the legs of said forked bracket and rotatively carried within said carrier member to contact opposing surfaces of said curvilinear surface of said one of said conductors to maintain a full current path between said conductors through all movements of said conductors, and spring means mounted to the legs of said forked bracket to constantly urge said contact screws into good electrical contact with said curvilinear surface of said one of said conductors.

3. In an electric switch of the rocker type, two conductors, means for connecting one of said conductors to the other of said conductors for rotative movement of said one of said conductors about the longitudinal axis of said one of said conductors, said means formed to maintain a full current path between said conductors through all rotative movements of said one of said conductors about said longitudinal axis through said one of said conductors, said means comprising a pair of inwardly biased bar contacts secured to said other of said conductors, a carrier member mounted about said one of said conductors to permit unlimited rotative movement of said one of said conductors within said carrier member about the longitudinal axis of said one of said conductors while preventing any movement of said one of said conductors along said longitudinal axis relative to said carrier member, and means mounted to said carrier member for projecting said one of said conductors between the bar contacts of said other of said conductors to maintain said bar contacts in full electrical current contact with opposing surfaces of said one of said conductors.

4. In an electric switch of the rocker type, two rigid conductors, means for connecting one end of one of said conductors to one end of the other of said conductors for relative pivotal movement therebetween and for rotative movement of said other of said conductors about its longitudinal axis, said means formed to maintain a full current path between said conductors through all of said movements of said conductors, a rocking insulator rockingly mounted in said switch, means for connecting the other end of said one of said conductors to said rocking insulator for relative pivotal movement therebetween and for rotative movement of said one of said conductors about its longitudinal axis, and support means for supporting the other end of said other of said conductors for relative pivotal movement therebetween and for rotative movement of said other of said conductors about an axis through said support means.

5. In an electric switch as claimed in claim 4, wherein said support means is formed to include an upstanding insulator mounted in said switch in the plane through which said rocking insulator is rockingly mounted.

6. In an electric switch as claimed in claim 4, wherein said support means is formed to include a line suspension insulator varying in position relative to said rocking insulator.

7. In an electric switch of the rocker type, two rigid conductors, means for connecting one end of one of said conductors to one end of the other of said conductors for relative pivotal movement therebetween and for rotative movement of said other of said conductors about its longitudinal axis, said means formed to maintain a full current path between said conductors through all of said movements of said conductors, the other end of said one of said conductors formed substantially as a curvilinear surface, a rocking insulator rockingly mounted in said switch, means for connecting said other end of said one of said conductors to said rocking insulator for relative pivotal movement therebetween and for rotative movement of said one of said conductors about its longitudinal axis, a third conductor comprising a pair of inwardly biased bar contacts and a line terminal, said rocking insulator, said third conductor and said one of said conductors relatively positioned to cause said curvilinear surface of said one of said conductors to engage said inwardly biased bar contacts when said rocking insulator is rocked toward said third conductor in a closing operation of said switch to maintain said bar contacts in full electrical current contact with opposing surfaces of said curvilinear surface of said one of said conductors, and support means including a terminal contact for supporting the other end of said other of said conductors for relative pivotal movement therebetween and for rotative movement of said other of said conductors about an axis through said support means to maintain a full current path between said terminal contact and said other of said conductors through all said movements of said other of said conductors.

8. In an electric switch of the rocker type, two rigid conductors, means for connecting one end of one of said conductors to one end of the other of said conductors for relative pivotal movement therebetween and for rotative movement of said other of said conductors about its longitudinal axis, said means formed to maintain a full current path between said conductors through all of said movements of said conductors, the other end of said one of said conductors formed substantially as a curvilinear surface, a rocking insulator rockingly mounted in said switch, means for connecting said other end of said one of said conductors to said rocking insulator for relative pivotal movement therebetween and for rotative movement of said one of said conductors about its longitudinal axis, a first upstanding insulator positioned in the plane through which said rocking insulator is rockingly mounted, a third conductor mounted on said first upstanding insulator and comprising a pair of inwardly biased bar contacts and a line terminal, said first upstanding insulator and said rocking insulator relatively positioned to permit said curvilinear surface of said one of said conductors to engage said inwardly biased bar contacts when said rocking insulator is rocked toward said first upstanding insulator to maintain said bar contacts in full electrical current contact with opposing surfaces of said curvilinear surface of said one of said conductors and support means including a terminal contact and a second upstanding insulator positioned in the plane through which said rocking insulator is rockingly mounted for supporting the other end of said other of said conductors for relative pivotal movement therebetween and for rotative movement of said other of said conductors about an axis through said support means to maintain a full current path between said other of said conductors and said terminal contact through all said movements of said other of said conductors.

9. In an electric switch of the rocker type, two rigid conductors, means for connecting one end of one of said conductors to one end of the other of said conductors for relative pivotal movement therebetween and for rotative movement of said other of said conductors about its longitudinal axis, said means formed to maintain a full current path between said conductors through all of said movements of said conductors, the other end of said one of said conductors formed substantially as a curvilinear surface, a rocking insulator rockingly mounted in said switch, means for connecting said other end of said one of said conductors to said rocking insulator for relative pivotal movement therebetween and for rotative movement of said one of said conductors about its longitudinal axis, an upstanding insulator mounted in said switch in the plane through which said rocking insulator is rockingly mounted, a third conductor mounted on said upstanding insulator and comprising a pair of inwardly biased bar contacts and a line terminal, said upstanding insulator and said rocking insulator relatively positioned to permit said curvilinear surface of said one of said conductors to engage said inwardly biased bar contacts when said rocking insulator is rocked toward said upstanding insulator to maintain said bar contacts in full electrical current contact with opposing surfaces of said curvilinear surface of said one of said conductors, and a line suspension insulator movably mounted to said switch, and support means including a terminal contact and mounted on said line suspension insulator for supporting the other end of said other of said conductors for relative pivotal movement therebetween and for rotative movement of said other of said conductors about an axis through said support means to maintain a full current path between said other of said conductors and said terminal contact through all said movements of said other of said conductors.

10. In an electric switch of the rocker type, a first rigid elongated conductor having one end thereof formed as a curvilinear surface, a second rigid elongated conductor having one end thereof formed substantially as a curvilinear surface, means for connecting the other end of said first conductor to said one end of said second conductor for relative pivotal movement therebetween and for rotative movement of said second conductor about its longitudinal axis, said means comprising opposing contact surfaces carried by said other end of said first conductor engaging said curvilinear surface of said second conductor to maintain a full current path between said conductors through all of said movements of said conductors, a rocking insulator rockingly mounted in said switch, means for connecting said one end of said first conductor to said rocking insulator for relative pivotal movement therebetween and for rotative movement of said first conductor about its longitudinal axis, a third conductor comprising a pair of inwardly biased bar contacts, said rocking insulator, said third conductor and said first conductor relatively positioned to permit said curvilinear surface of said first conductor to engage said inwardly biased bar contacts when said rocking insulator is rocked toward said third conductor to maintain said bar contacts in full electrical current contact with opposing surfaces of said curvilinear surface of said first conductor, and support means including a terminal contact for supporting the other end of said second conductor for relative pivotal movement therebetween and for rotative movement of said second conductor about an axis through said support means to maintain a full current path between said other of said conductors and said terminal contact through all said movements of said other of said conductors.

11. In an electric switch of the rocker type, a first rigid elongated conductor having one end thereof formed substantially to include a curvilinear surface, a second rigid elongated conductor formed substantially at one end thereof to include a curvilinear surface, means for connecting the other end of said first conductor to said one end of said second conductor for relative pivotal movement therebetween and for rotative movement of said second conductor about its longitudinal axis, and cooperating contact means carried by said other end of said first conductor and engaging opposing contact surfaces of said curvilinear surface of said second conductor to maintain a full current path between said conductors through all of said movements of said conductors, a rocking insulator rockingly mounted in said switch, means for connecting said one end of said first conductor to said rocking insulator for relative pivotal movement therebetween and for rotative movement of said first conductor about its longitudinal axis, a third conductor mounted in said switch and comprising a pair of inwardly biased bar contacts, said rocking insulator, said bar contacts and said first conductor relatively positioned to permit said curvilinear surface of said first conductor to engage said inwardly biased bar contacts when said rocking insulator is rocked toward said third conductor to maintain said bar contacts in full electrical contact with opposing surfaces of said curvilinear surface of said first conductor, and support means including a terminal contact for supporting the other end of said second conductor for relative pivotal movement therebetween and for rotative movement of said second conductor about an axis through said support means to maintain a full current path between said conductor and said terminal contact through all of said movements of said second conductor.

12. In an electric switch of the rocker type, a first conductor, a second rigid elongated conductor, means slidably connecting said second conductor to said first conductor while permitting rotative movement of said second conductor about its longitudinal axis, said means formed to maintain a full current path between said conductors in all positions of said rotative movement of said second conductor about its longitudinal axis, said means including a member operative during the first part of the opening operation of said switch to exert a power pull on said second conductor at an angle to its normal path of sliding to produce an effective pry-out action by means of a cam movement of said member relative to said first conductor to facilitate the separation of said conductors under iced conditions.

13. In an electric switch of the rocker type, a first upstanding insulator, a first conductor mounted on said first upstanding insulator and comprising a pair of inwardly biased bar contacts and a line terminal, a rocking insulator rockingly mounted in a plane passing between said bar contacts, a second rigid elongated conductor, a carrier member mounted on one end of said second conductor for rotative movement about the longitudinal axis of said second conductor, a link having a cam profile at one end thereof and a pair of spaced apart stops at the other end thereof, means pivotally mounting said link to said rocking insulator so that said pair of spaced apart stops permits a limited pivotal movement of said link relative to said rocking insulator in the plane in which said rocking insulator is rockingly mounted, means pivotally mounting said link to said carrier for relative pivotal movement therebetween about an axis perpendicular to the plane in which said rocking insulator is rockingly mounted, said means arranged so that when said rocking insulator is rocked toward said first upstanding insulator, said rocking insulator and said link operate as a substantially straight lever arm to cause said second conductor to engage said bar contacts to maintain a full current path between said line terminal and said second conductor through any rotation of said second conductor about its longitudinal axis, and so that when said rocking insulator is rocked away from said first upstanding insulator to disengage said second conductor from said bar contacts, said cam profile engages said bar contacts as a fulcrum, and said rocking insulator and said link operate in a toggle action to apply a multiplied force between said carrier member and said bar contacts as a pry-out effect.

14. In an electric switch, two elongated rigid conductors, one of said conductors formed substantially at one end thereof as a curvilinear surface, means for connecting said one of said conductors to the other of said conductors for relative pivotal movement therebetween and for rotative movement about the longitudinal axes of said conductors, said means comprising a carrier member mounted about said one end of said one of said conductors for rotative movement about the longitudinal axis of said one of said conductors while prevented from any movement along the longitudinal axis of said one of said conductors, a forked bracket secured to the end of said other of said conductors, the ends of the legs of said forked bracket carrying aligned contact studs rotatively supported within said carrier member to contact opposing surfaces of said curvilinear surface of said one of said conductors to maintain a full current path between said conductors through all movements of said conductors, and spring means mounted on the legs of said forked bracket to constantly urge said contact studs into good electrical contact with said curvilinear surface of said one of said conductors.

References Cited in the file of this patent

UNITED STATES PATENTS

| | | |
|---|---|---|
| 1,975,999 | Young | Oct. 9, 1934 |
| 2,140,907 | Froland | Dec. 20, 1938 |
| 2,211,161 | Ramsey | Aug. 13, 1940 |
| 2,229,006 | Rudd | Jan. 14, 1941 |
| 2,521,484 | Schmidt | Sept. 5, 1950 |
| 2,688,666 | Gilliland et al. | Sept. 7, 1954 |